(12) United States Patent
Wu

(10) Patent No.: US 10,031,629 B2
(45) Date of Patent: Jul. 24, 2018

(54) OLED PANEL AND TOUCH DETECTION METHOD

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventor: Tianyi Wu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

(*) Notice: Subject to any disclaimer, the term of this patent is extended or adjusted under 35 U.S.C. 154(b) by 275 days.

(21) Appl. No.: 15/175,543

(22) Filed: Jun. 7, 2016

(65) Prior Publication Data

US 2017/0220150 A1    Aug. 3, 2017

(30) Foreign Application Priority Data

Jan. 29, 2016   (CN) .......................... 2016 1 0066880

(51) Int. Cl.
```
G09G 3/30      (2006.01)
G06F 3/044     (2006.01)
H01L 27/32     (2006.01)
H01L 51/52     (2006.01)
G06F 3/041     (2006.01)
H01L 27/12     (2006.01)
```

(52) U.S. Cl.
CPC ............ *G06F 3/044* (2013.01); *G06F 3/0412* (2013.01); *G06F 3/0416* (2013.01); *H01L 27/323* (2013.01); *H01L 27/3248* (2013.01); *H01L 27/3276* (2013.01); *H01L 51/5209* (2013.01); *H01L 51/5225* (2013.01); *H01L 27/124* (2013.01); *H01L 2251/301* (2013.01); *H01L 2251/308* (2013.01)

(58) Field of Classification Search
CPC ....... G02F 1/13338; G06F 3/044; G06F 3/045
USPC ...................................... 345/76–77, 173–174
See application file for complete search history.

(56) References Cited

U.S. PATENT DOCUMENTS

2004/0130516 A1* 7/2004 Nathan ................... H01L 27/12
                                                        345/82
2015/0169121 A1* 6/2015 Yao ....................... G06F 3/0412
                                                        345/174

FOREIGN PATENT DOCUMENTS

CN           101894856 A        11/2010

* cited by examiner

*Primary Examiner* — Roy P Rabindranath
(74) *Attorney, Agent, or Firm* — Kilpatrick Townsend & Stockton LLP

(57) ABSTRACT

An OLED panel is provided. The OLED panel may include multiple matrix-arranged TFTs, an anode layer, an organic light emitting layer, a cathode layer, and/or any other components. The anode layer can have multiple anodes, formed on one side of the TFTs. The organic light emitting layer can be formed on one side of the anode layer away from the TFTs. The cathode layer can have multiple cathodes and be formed on one side of the organic light emitting layer away from the anode layer. The cathodes can pass through the organic light emitting layer and be electrically connected to the corresponding TFTs to form pixel electrodes. A time-division drive module can be electrically connected to the anodes, which can be configured to multiplex time-divisionally to alternately form common electrodes or touch electrodes.

19 Claims, 13 Drawing Sheets

OLED PANEL AND TOUCH DETECTION METHOD

CROSS-REFERENCE TO RELATED APPLICATIONS

This application is based upon and claims priority to Chinese Patent Application 201610066880.1, filed on Jan. 29, 2016, the entire contents of which are incorporated herein by reference.

TECHNICAL FIELD

The present invention relates to the field of display technologies, and more particularly, to an organic light emitting diode (OLED) panel whose anodes are multiplexed into touch electrodes and a touch detection method.

BACKGROUND

FIG. 1 is a schematic cross-sectional view of an OLED panel in the prior art. FIG. 2 is a cross-sectional view of the OLED panel in the prior art. Schematic structural diagrams of a majority of existing OLED products are as shown in FIG. 1 and FIG. 2. An existing OLED panel includes: a thin film transistor (TFT) substrate 1', an anode layer 3' (including multiple anodes 30'), an organic light emitting layer, a cathode layer 5', a cover plate 6' and touch electrodes 7'.

Specifically, the TFT substrate 1' has multiple matrix-arranged thin-film transistors (hereinafter referred to as TFTs) 2'. The anode layer 3' having multiple anodes 30' is formed on the TFT substrate 1'. An organic light emitting layer 4' and a pixel definition layer 14' are formed on the anode layer 3'. The pixel definition layer 14' has multiple matrix-arranged openings to define a pixel region, and the organic light emitting layer 4' is positioned in the openings of the pixel definition layer 14'. The cathode layer 5' is formed on the organic light emitting layer 4'. The cover plate 6' is formed on the cathode layer 5'. The touch electrodes 7' are formed on the cover plate 6' and are electrically connected to a touch recognition module 10' which determines a touch position by detecting the capacitance change of the touch electrodes 7'. The anodes 30' are electrically connected to the organic light emitting layer 4' and serve as pixel electrodes thereof. Each of the anodes 30' corresponds to one subpixel. The cathode layer 5' is electrically connected to the organic light emitting layer 4', serving as the common electrode, and is electrically connected with a first power input terminal 8' (for example, PVEE). A gate electrode G of one TFT 2' is electrically connected with a data line 11'; a source electrode S of the TFT 2' is electrically connected with a second power input terminal 9' (for example, PVDD); and a drain electrode D of the TFT 2' is electrically connected with the anodes 30'.

FIG. 3 is a top view of an anode layer in the OLED panel in the prior art. FIG. 4 is a top view of a cathode layer in the OLED panel in the prior art. Further referring to FIG. 1 to FIG. 4, in the OLED panel in the prior art, the cathode layer 5' includes multiple cathodes 50' (FIG. 1 and FIG. 4 only show one cathode 50', but this is not intended to be limiting). Each cathode 50' corresponds to multiple anodes 30', and the anodes 30' and the cathode layer 5' are mainly used for image display of the OLED panel. In the existing OLED panels, TFTs 2' drive the OLED panel, the OLED panel includes multiple anodes 30', each of the anodes 30' corresponds to one pixel unit, and the cathode layer 5' serves as a planar common electrode. Therefore, in view of the shielding effect of the cathode layer 5' on an electric field, an integrated touch control generally adopts an On cell structure. Therefore, the touch electrodes 7' are positioned outside the cover plate 6'. The touch electrodes 7' may be self-capacitive or mutual-capacitive, which is unnecessarily described herein.

The major problem present in the prior art is: due to shielding effect of the cathode layer in a top drive OLED panel, for the most part, the integrated touch scheme may only adopt the On cell structure. However, this On cell touch scheme may affect the thickness of an OLED product, and in the On cell touch structure, a flexible printed circuit (FPC) needs to be laminated on the cover plate 6' of the OLED pane, which affects the product appearance and increases the cost.

SUMMARY

According to an aspect of the present invention, there is provided an OLED panel, including: multiple matrix-arranged TFTs; an anode layer having multiple anodes, formed on one side of the TFTs; an organic light emitting layer, formed on one side of the anode layer away from the TFTs; a cathode layer having multiple cathodes, formed on one side of the organic light emitting layer away from the anode layer. The cathodes pass through the organic light emitting layer and are electrically connected to the corresponding TFTs to form pixel electrodes; and a time-division drive module electrically connected to the anodes configured to multiplex time-divisionally to alternately form common electrodes or touch electrodes.

According to another aspect of the present invention, there is further provided a touch detection method of an OLED panel, where the foregoing OLED panel is used, including: forming the cathodes into pixel electrodes of the OLED panel, performing multiplex time-division on the anodes to alternately form into one type of common electrodes and touch electrodes of the OLED panel.

When the anodes are the touch electrode, the time-division drive module captures a self-capacitance change of each of the touch electrodes or captures a mutual-capacitance change between the touch electrodes to position a touch location.

BRIEF DESCRIPTION OF THE DRAWINGS

By referring to the detailed description of non-limiting embodiments with reference to the following accompanying drawings, other features, objectives and advantages of the present invention will become more apparent.

DETAILED DESCRIPTION

Figure 1:
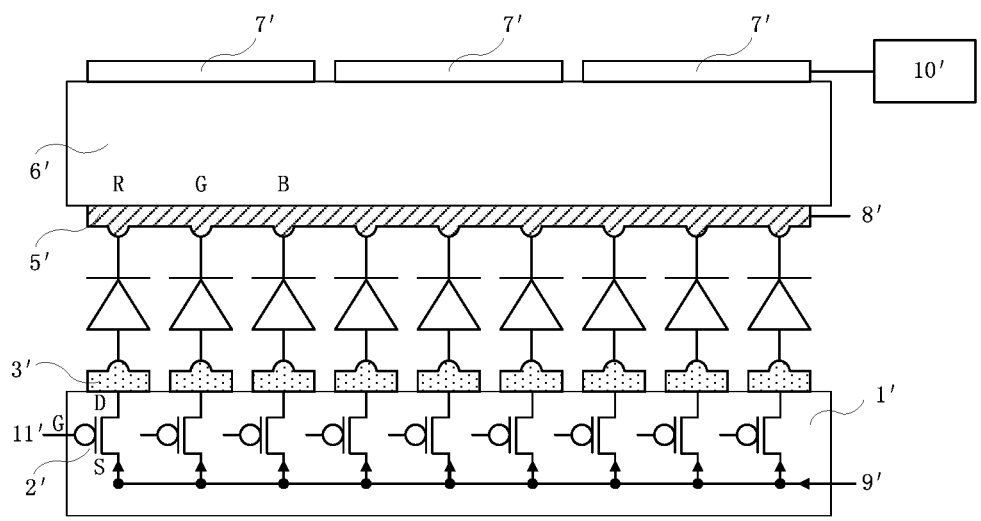
FIG. 1 is a schematic cross-sectional view of an OLED panel in the prior art.
Figure 2:
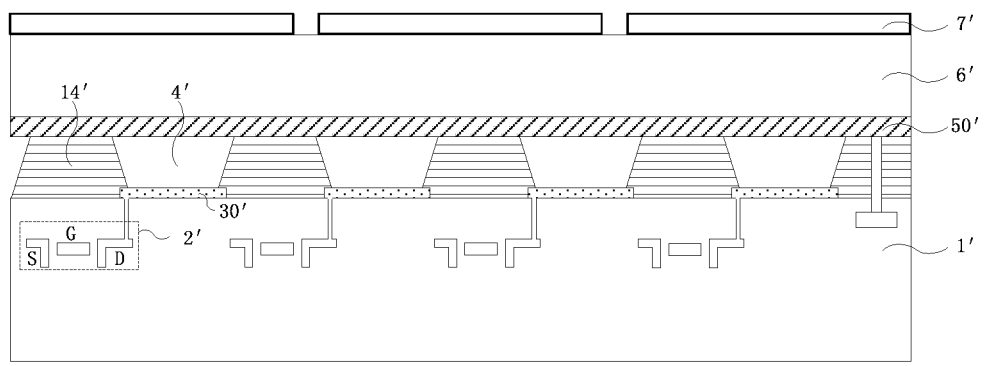
FIG. 2 is a cross-sectional view of the OLED panel in the prior art.
Figure 3:
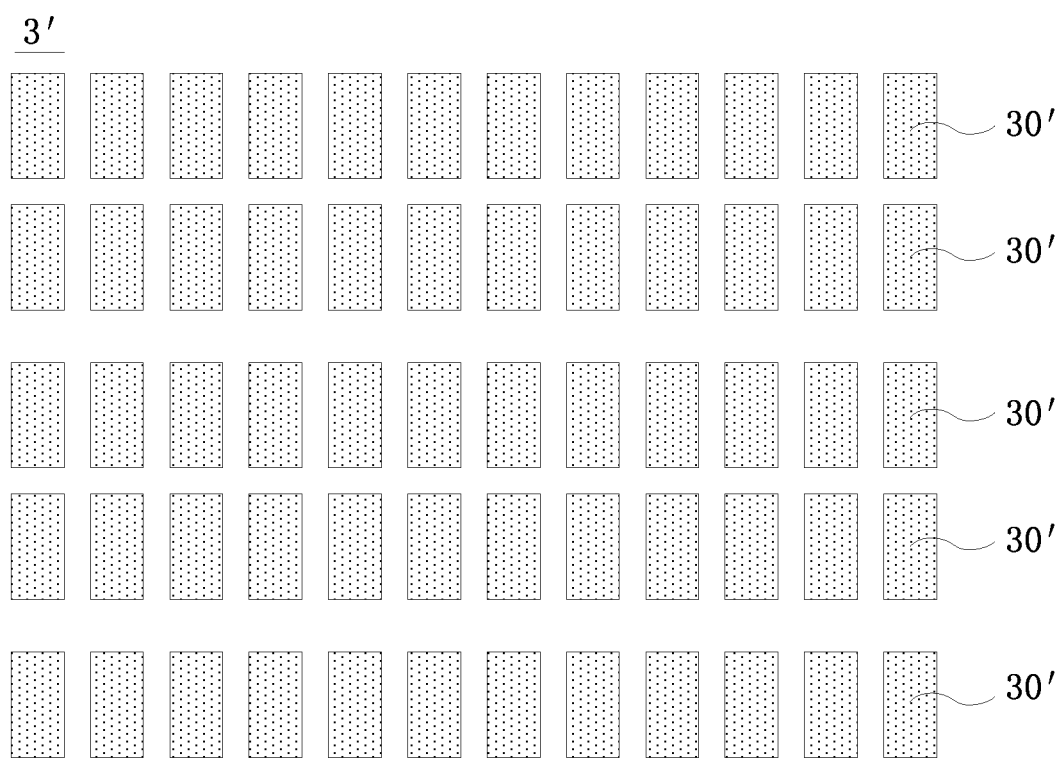
FIG. 3 is a top view of an anode layer in the OLED panel in the prior art.
Figure 4:
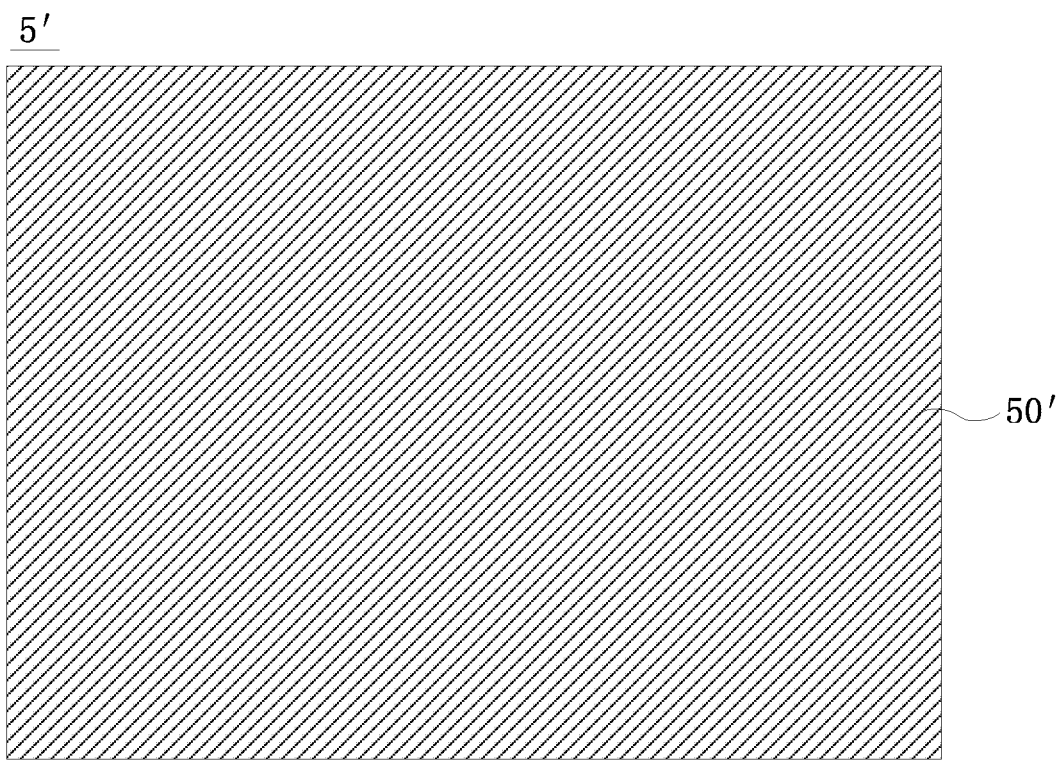
FIG. 4 is a top view of a cathode layer in the OLED panel in the prior art.

Example implementations will now be described in further detail with reference to the accompanying drawings. The example implementation, however, may be embodied in various forms, and should not be construed as being limited to the implementations set forth herein. Rather, these implementations are provided so that the present invention will become thorough and complete, and will fully convey the concept of the inventive concept to those skilled in the art. Similar reference numerals denote the same or like structures throughout the accompanying drawings, and thus repeat description thereof will be omitted.

Figure 5:
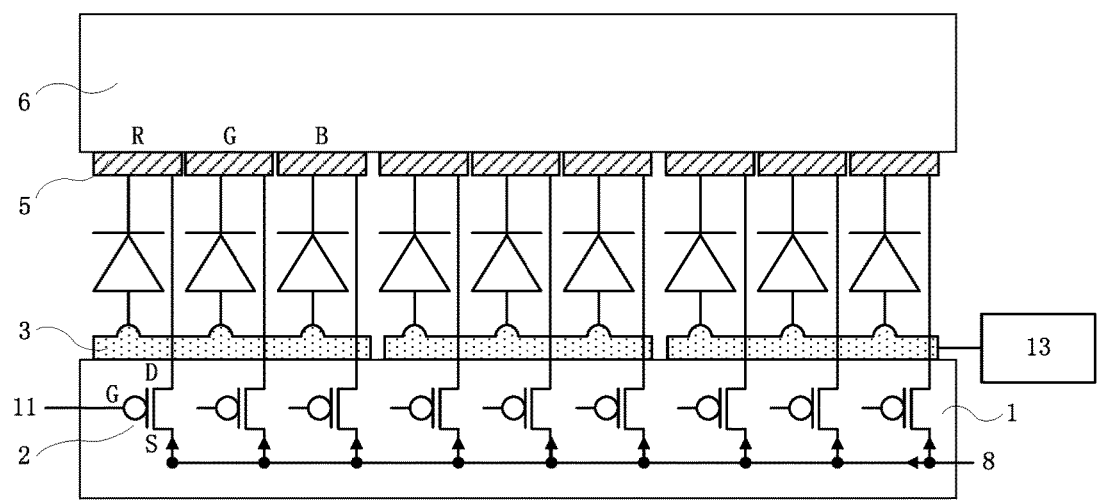
FIG. 5 is a schematic cross-sectional view of an OLED panel of the present invention.
Figure 6:
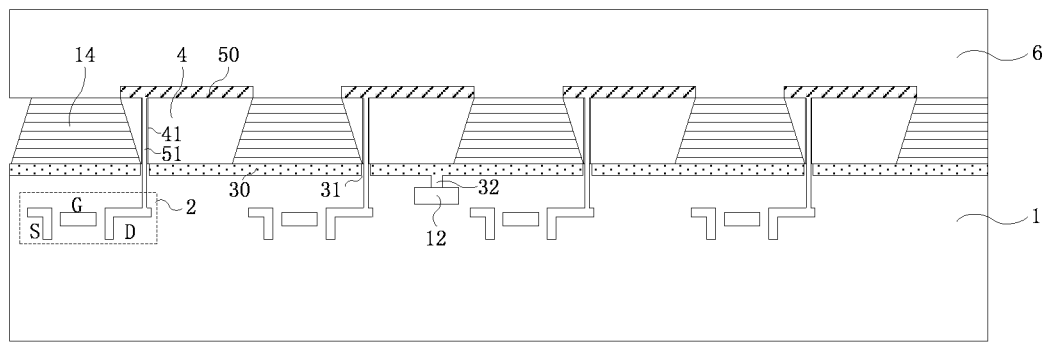
FIG. 6 is a cross-sectional view of the OLED panel of the present invention.

FIG. 5 is a schematic cross-sectional view of the OLED panel of the present invention. FIG. 6 is a cross-sectional view of the OLED panel of the present invention. As shown in FIG. 5 and FIG. 6, the OLED panel of the present invention includes a TFT substrate 1, an anode layer 3, an organic light emitting layer 4, a cathode layer 5 and a cover plate 6 stacked in a sequence from bottom to top. The TFT substrate 1 has multiple matrix-arranged TFTs 2. The anode layer 3 is formed on the TFTs 2, and the anode layer 3 includes multiple matrix-arranged anodes 30. The organic light emitting layer 4 and a pixel definition layer 14 are formed on the anode layer 3. The pixel definition layer 14 has multiple matrix-arranged openings to define a pixel region, and the organic light emitting layer 4 is positioned in the openings of the pixel definition layer 14. The cathode layer 5 is formed on the organic light emitting layer 4, the cathode layer 5 includes multiple matrix-arranged cathodes 50, each of the cathodes 50 passes through the organic light emitting layer 4 and is electrically connected to a drain electrode D of the corresponding TFT 2 to form a pixel electrode. Each of the anodes 30 is respectively electrically connected to a time-division drive module 13. For example, each of the anodes 30 is electrically connected to the time-division drive module 13 by means of an anode wire 12, but this is not intended to be limiting. The anodes 30 are configured to multiplex time-divisionally to alternately form common electrodes or touch electrodes. The time-division drive module 13 time-division outputs, to the anodes 30, a touch drive voltage or a display drive voltage. Thus the OLED panel of the present invention may also make a touch recognition without extra touch electrodes.

Referring to FIG. 5, in this embodiment, reference is made by taking an example in which each pixel unit includes three subpixels (subpixel R, subpixel G and subpixel B). Each of the anodes 30 may serve as the common electrode of a pixel unit. That is, each of the anodes 30 corresponds to one pixel unit, and these three subpixels, namely, subpixel R, subpixel G and subpixel B, of each pixel unit respectively corresponds to an independent cathode 50, but this is not intended to be limiting. In other embodiments, one anode 30 (common electrode) may also be configured to control multiple pixel units. One pixel unit may also include multiple subpixels, and each subpixel respectively corresponds to an independent cathode 50.

Figure 7:
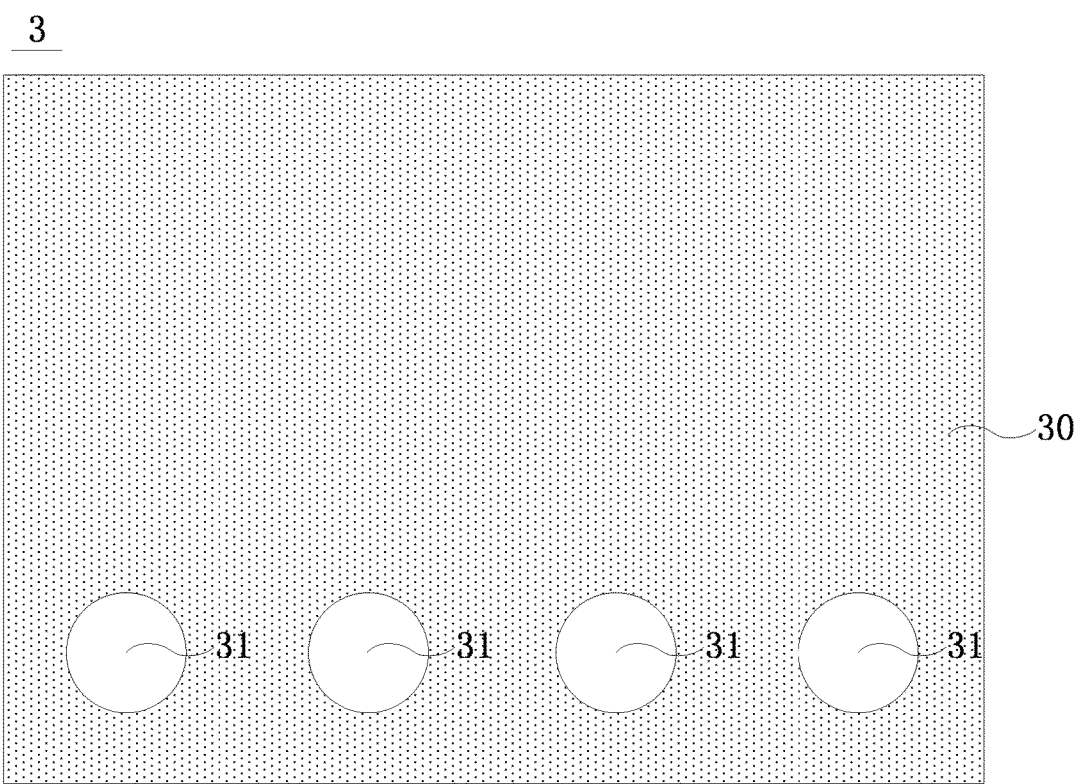
FIG. 7 is a top view of an anode layer in the OLED panel of the present invention.
Figure 8:
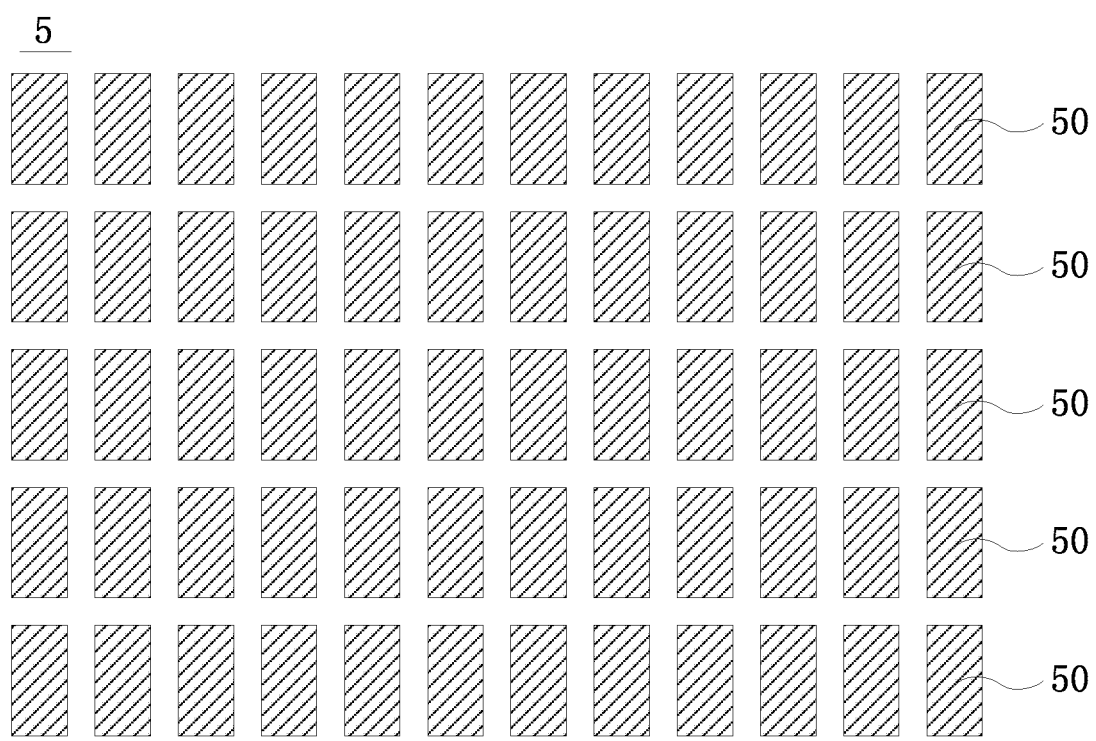
FIG. 8 is a top view of a cathode layer in the OLED panel of the present invention.
Figure 9:
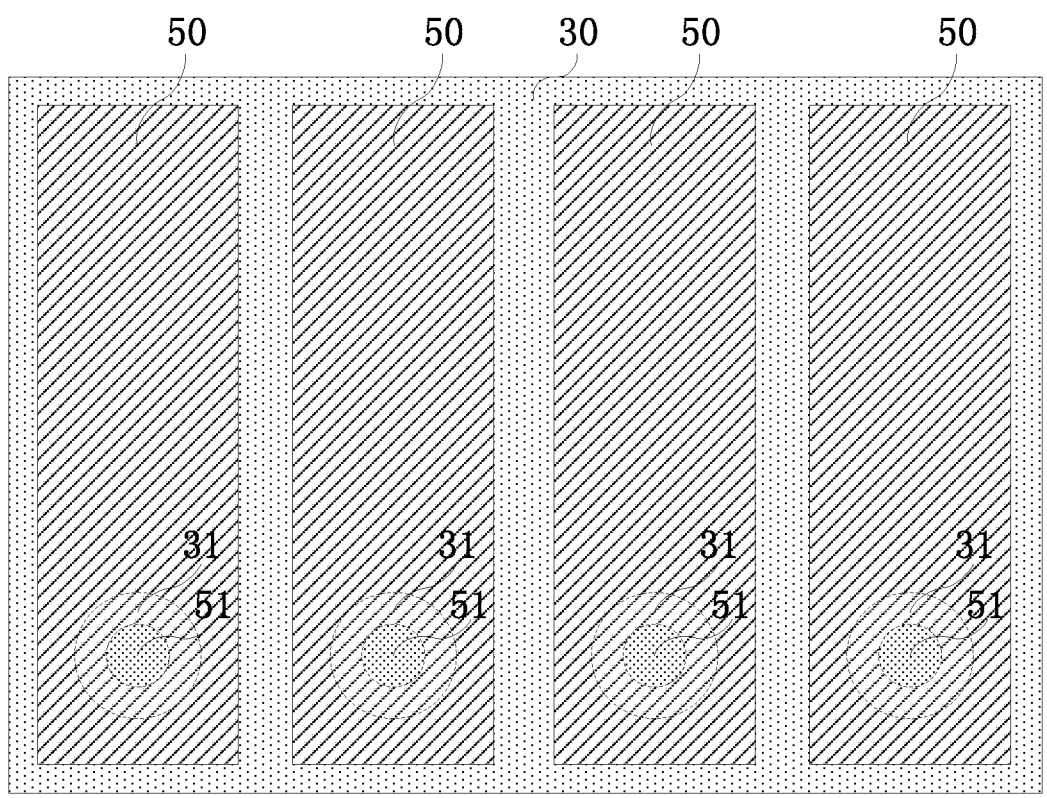
FIG. 9 is a top view of superposition of cathodes and anodes in the OLED panel of the present invention.

FIG. 7 is a top view of an anode layer in the OLED panel of the present invention. As shown in FIG. 7, each of the anodes 30 in the anode layer 3 in the OLED panel of the present invention includes multiple first via holes 31. FIG. 8 is a top view of the cathode layer in the OLED panel of the present invention. As shown in FIG. 8, the cathode layer 5 in the OLED panel of the present invention includes multiple matrix-arranged cathodes 50. FIG. 9 is a top view of superposition of the cathodes 50 and the anodes 30 in the OLED panel of the present invention. As shown in FIG. 9, the multiple cathodes 50 of the cathode layer 5 in the OLED panel of the present invention are superposed on one anode 30 of the anode layer 3. Further referring to FIG. 5 to FIG. 9, one anode 30 in the OLED panel of the present invention corresponds to multiple cathodes 50. The anodes 30 and the cathodes 50 are not only configured to display images of the OLED in a display stage of the OLED panel, but also configured to carry out a touch recognition by means of time-divisionally multiplex of the anodes 30 in a touch recognition stage of the OLED panel. The cathodes 50 have leads 51 extending toward the TFT 2, the organic light emitting layer 4 and/or the anodes 30 have multiple channels, and the leads 51 pass through the channels and are electrically connected to the drain electrode D of the TFT 2. The channels in this embodiment mainly include contact holes 41 disposed on the organic light emitting layer 4 and first via holes 31 disposed on the anode layer 3. The method for reserving the contact holes 41 may be as below: in the process of evaporation of the organic light emitting layer 4 of the OLED, a mask used is designed, in each subpixel, with a barrier region having a fixed location and a specific size. In the process of evaporation, metal patterns within the barrier region will obstruct OLED light-emitting materials from depositing on the anode layer 3, and contact holes 41 through which the cathodes 50 are in contact with the TFTs 2 in the TFT substrate 1 are reserved on the obstructed areas, but this is not intended to be limiting. Alternatively, in an OLED printing process, the required OLED patterns may be directly printed, and the area in each pixel where there is no OLED light-emitting material may be selected as the contact holes 41. Still alternatively, in a high pixel density product, when there is no enough space in each subpixel to form a blank area whether by evaporation process or by printing process, a laser melting process may be added after the OLED patterns are formed, and the laser melting is performed on the areas where the contact holes 41 are needed to be formed. Because gaps (not show in the figures) exist between the anodes 30 of the anode layer 3, so that the leads 51 of the cathodes 50 may pass through and then are connected to the TFTs 2 by disposing contact holes penetrating though the anode layer 3, or by means of the gaps between the anodes 30, or by simultaneously using the contact holes and the gaps between the anodes 30, but this is not intended to be limiting.

In one embodiment of the present invention, the organic light emitting layer 4 in the present invention includes a hole injection layer, a hole transfer layer, a light emitting material layer, an electron transfer layer and an electron injection layer. These layers are stacked in sequence from the anode layer 3 to the cathode layer 5. That is, the OLED panel in the present invention is a top drive OLED panel. Preferably, material of the cathodes 50 in the present invention is magnesium-silver alloy, and an independent pixel is implemented by means of an evaporation mask. But this is not intended to be limiting. Preferably, the anodes 30 have a three-layer laminated construction, material at the first layer is indium tin oxide, material at the second layer is silver, material at the third layer is indium tin oxide, and the second layer is interposed between the first layer and the third layer, but this is not intended to be limiting. The TFT 2 in the present invention may be an NMOS transistor to reduce the effect on the OLED threshold.

Specific to the top drive OLED panel in the present invention, during evaporation, the cathodes 50 are partitioned, in subpixels, into multiple independent units, are electrically connected with the drive TFT 2 of the TFT substrate 1 by means of via holes or the like, and are controlled by the TFT 2 of the TFT substrate 1. The anodes 30 are positioned on the TFT substrate 1, not electrically connected with the TFT 2, multiplexed into touch electrodes, and electrically connected with the time-division drive module 13 directly. The touch drive voltage or the display drive voltage is outputted time-divisionally by the time-division drive module 13 to the anodes 30. When the touch drive voltage is outputted to the anodes 30, the anode 30s serve as the touch electrodes for touch recognition. When the display drive voltage is outputted to the anodes 30, the anodes 30 are used for display of the organic light emitting layer 4. The gate electrode G of each TFT 2 in the TFT substrate 1 is electrically connected to a data line 11. The source electrode S of each TFT 2 is electrically connected to a first power input terminal 8 (for example, PVEE). The drain electrode D of each TFT 2 is electrically connected to the leads 51 of the cathodes 50. That is, the working state of each TFT 2 is controlled by the data line 11, and then the working state of the cathodes 50 is controlled, and is matched with the state of outputting, by the time-division drive module 13, the touch drive voltage or the display drive voltage. The display and the touch of the time-division drive module 13 in the present invention are operated time-divisionally. When the anodes 30 serve as the touch electrodes, the TFT 2 for driving the OLED is in an off state. At that moment, the cathode 50 corresponding to each subpixel is in a floating state and the touch signal of the anodes 30 are not shielded. In this way, the touch effect is not affected.

To the anodes 30 in the anode layer 3 of the present invention, each anode 30 in the same plane may independently form a self-capacitive touch electrode, or two adjacent anodes 30 respectively serve as a touch drive electrode and a touch detection electrode to form mutual-capacitive touch electrodes, but this is not intended to be limiting. Correspondingly, the time-division drive module 13 in the present invention may be a detecting unit for detecting the self-capacitance of the touch electrode, or a detecting unit for detecting the mutual capacitance between the touch electrodes, but this is not intended to be limiting. The following respectively introduces the two different structures with reference to FIG. 10 to FIG. 13.

Figure 10:
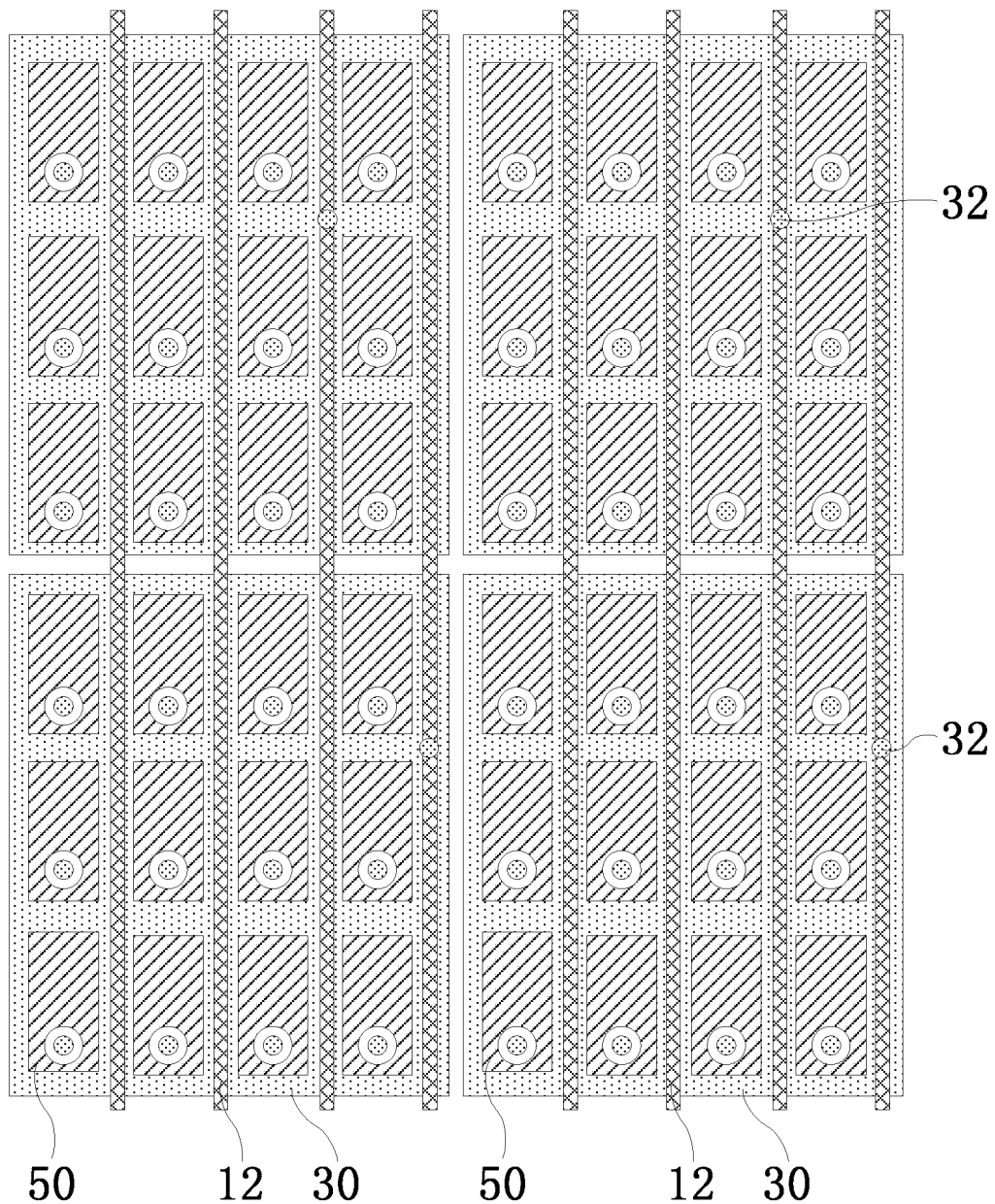
FIG. 10 is a local top view of layout of self-capacitive anodes in the OLED panel of the present invention.
Figure 11:
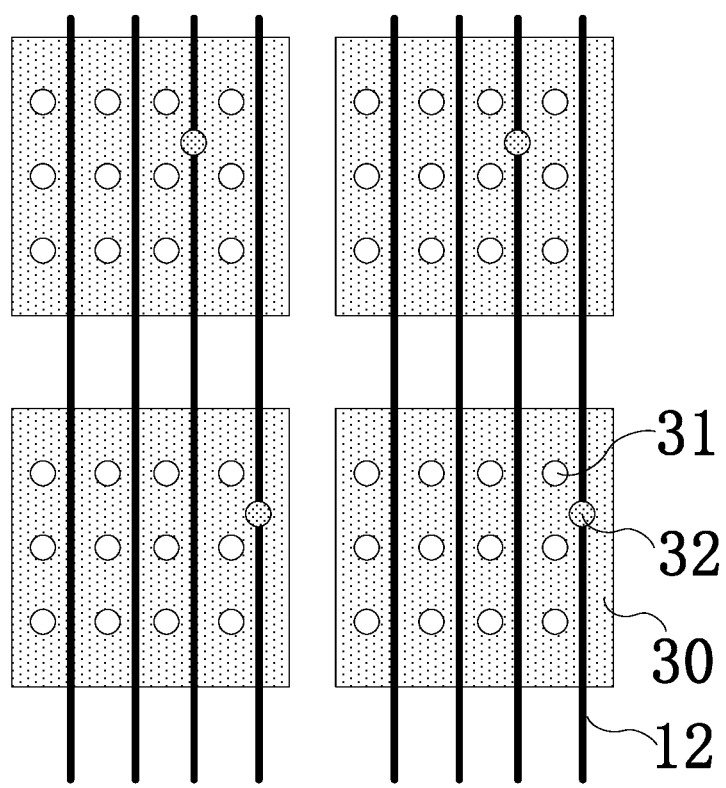
FIG. 11 is a local top view of layouts of the self-capacitive anodes and anode wires in the OLED panel of the present invention.

FIG. 10 is a local top view of layout of self-capacitive anodes in the OLED panel of the present invention. FIG. 11 is a local top view of layouts of the self-capacitive anodes and anode wires in the OLED panel of the present invention. As shown in FIG. 10 and FIG. 11, the anodes 30 in the present invention form self-capacitive touch electrodes in the same plane. Twelve cathodes 50 in the present invention are matrix-arranged on one anode 30. The anode wires 12 are arranged under the anodes 30 along a first direction (for example, a panel length direction). The anode wires 12 are respectively connected to each anode 30 by means of second via holes 32. The time-division drive module 13 may include a self-capacitance change detection unit for capturing the self-capacitance change of each touch electrode. When the anodes 30 serve as the touch electrodes, the TFT 2 for driving the OLED is in an off state. At that moment, the cathode corresponding to each subpixel is in a floating state, and the touch signal of the anodes 30 is not shielded. Thus each anode 30 may independently serve as the touch electrode for touch recognition. Because a finger also is a conductor, in the time-division drive module 13, the detecting unit for detecting the self-capacitance of the touch electrode may sense the concrete touch position by detecting that the self-capacitance of the anodes 30 in which positions changes due to the finger touching the OLED panel.

Figure 12:
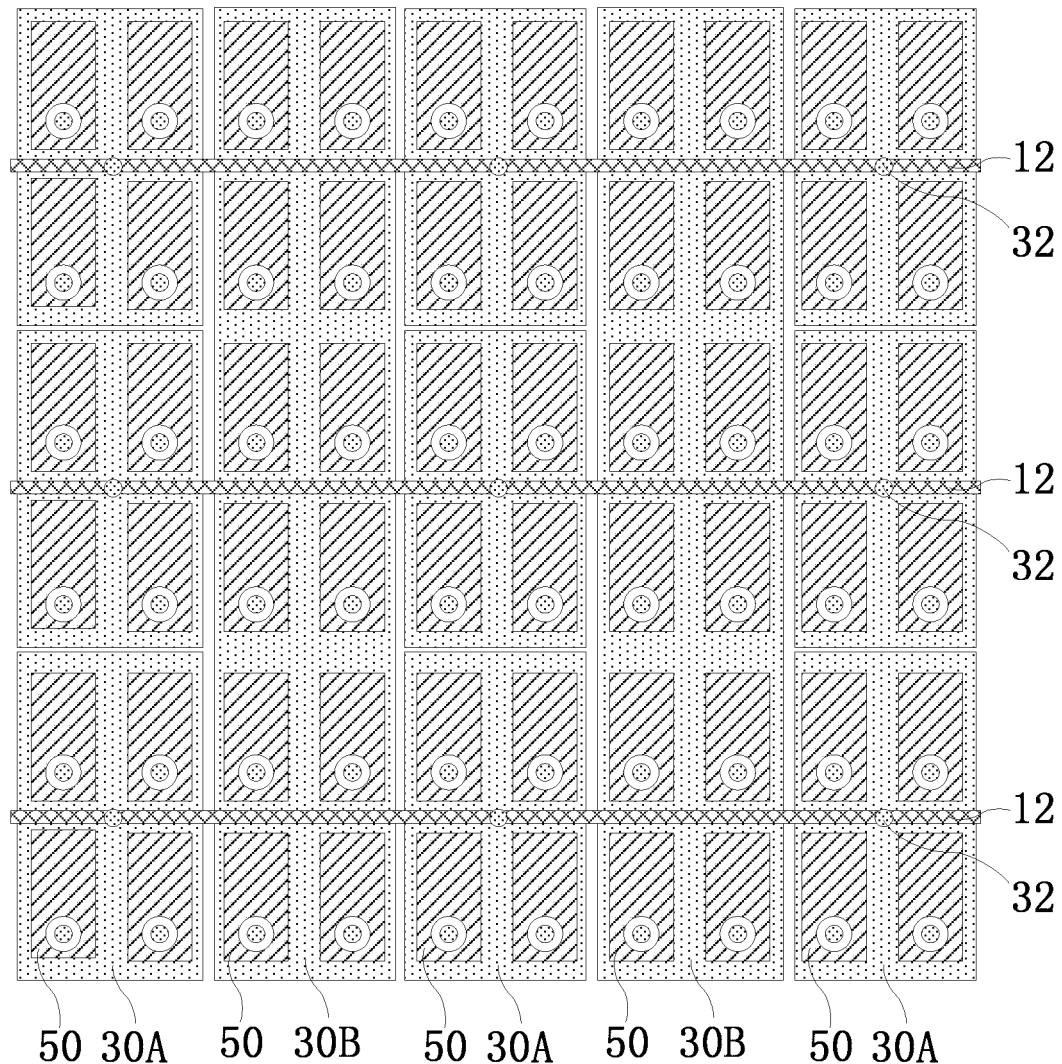
FIG. 12 is a local top view of layout of mutual-capacitive anodes in the OLED panel of the present invention.
Figure 13:
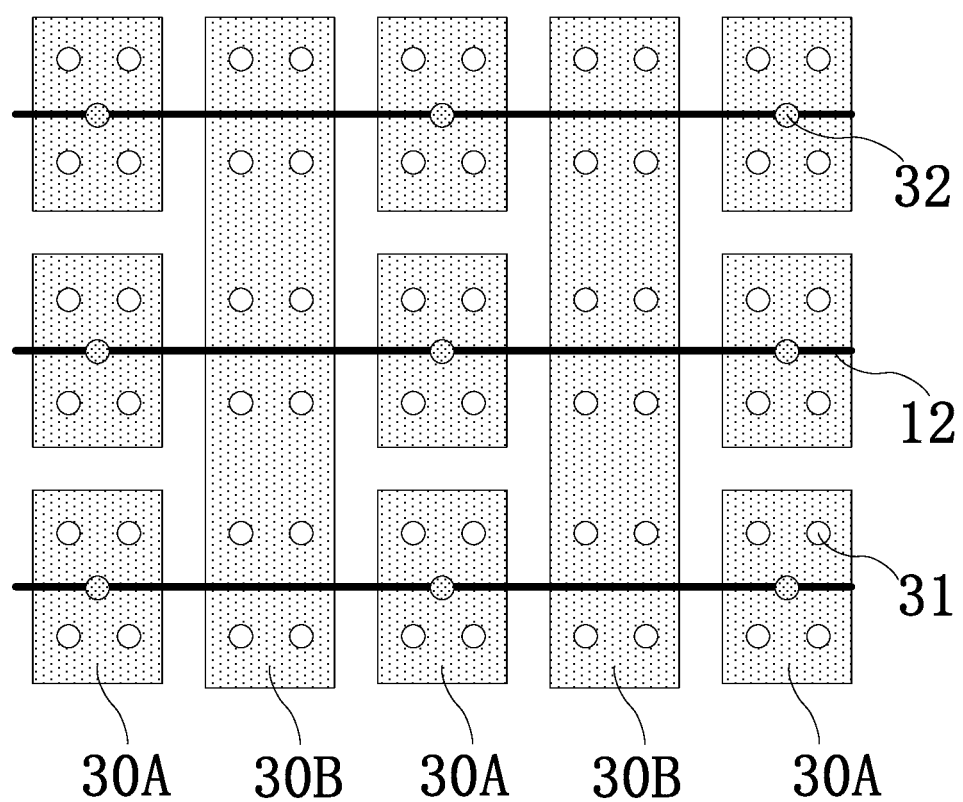
FIG. 13 is a local top view of layouts of the mutual-capacitive anodes and anode wires in the OLED panel of the present invention.

In another embodiment of the present invention, FIG. 12 is a local top view of layout of mutual-capacitive anodes in the OLED panel of the present invention. FIG. 13 is a local top view of layouts of the mutual-capacitive anodes and anode wires in the OLED panel of the present invention. As shown in FIG. 12 and FIG. 13, the anodes 30 in the anode layer 3 may include several columns of touch detection electrodes 30A and several touch drive electrodes 30B extending along the column direction, each column of touch detection electrodes 30A includes multiple touch detection electrodes 30A disposed in an insulated manner, and the several columns of touch detection electrodes 30A and the several touch drive electrodes 30B extending along the column direction are arranged alternatively. The anode wires 12 extend along the row direction (perpendicular to the column direction) and are arranged along the column direction. Each of the anode wires 12 is electrically connected to each of the touch detection electrodes 30A respectively through the second via holes 32, and each of the anode wires 12 is connected to the time-division drive module 13. Each of the touch drive electrodes 30B is connected to the time-division drive module 13 by means of touch drive wires (not shown in the figures) in the OLED panel. In this embodiment, the touch drive wires and the anode wires 12 are positioned in different layers. When the anodes 30 serve as the touch electrodes, the TFT 2 for driving the OLED is in an off state. At that moment, the cathode corresponding to each subpixel is in a floating state, and the touch signal of the anodes 30 is not shielded. At that moment, a pulse signal is inputted into the touch drive electrodes 30B, and mutual capacitance is formed between the touch drive electrodes 30B and the touch detection electrodes 30A. Because a finger also is a conductor, in the time-division drive module 13, the detecting unit for detecting the mutual capacitance between the touch electrodes may sense the concrete touch position by detecting that the mutual capacitance between the touch drive electrodes 30B and the touch detection electrodes 30A in which positions changes due to the finger touching the OLED panel.

In one embodiment of the present invention, the time duration for outputting the display drive voltage to the anodes 30 by the time-division drive module 13 accounts for 70%-90% of a total time duration (the total time duration refers to the sum total of the time duration for outputting the display drive voltage by the time-division drive module 13 and the time duration for outputting the touch drive voltage by the time-division drive module 13), but this is not intended to be limiting. If the time duration for outputting the display drive voltage to the anodes 30 by the time-division drive module 13 is too long, the effect of touch positioning is reduced. However, if the time duration for outputting the display drive voltage to the anodes 30 by the time-division drive module 13 is too short, the display effect of the OLED panel may be reduced. Therefore, within 70%-90% of the total time, the anodes 30 serve as common electrodes of the OLED panel to drive the organic light emitting layer 4 to display images, and in the rest time the anodes 30 serve as the touch electrodes. The time duration for outputting the touch drive voltage to the anodes 30 by the time-division drive module 13 may range from 2 ms to 5 ms, but this is not intended to be limiting.

The present invention also provides a touch detection method of an OLED panel, where the foregoing OLED panel is used. The method includes: forming the cathodes 50 into pixel electrodes of the OLED panel, performing time-division multiplex on the anodes 30 to alternately form into one type of common electrodes and touch electrodes of the OLED panel, and time-division outputting a touch drive voltage or a display drive voltage to the anodes 30 by the time-division drive module 13. When the time-division drive module 13 outputs the touch drive voltage to the anodes 30, the anodes serve as the touch electrodes, and the time-division drive module 13 captures the self-capacitance change of each of the touch electrodes or captures the mutual-capacitance change between the touch electrodes to position a touch location. When the anodes 30 are multiplexed into the touch electrodes, the corresponding TFT 2 is in an off state, and the cathodes 50 of corresponding subpixels are in a floating state.

Therefore, in the present invention, the anodes 30 have a first state in which the anodes 30 serve as the common electrodes, and have a second state in which the anodes 30 serve as the touch electrodes. The states of the anodes 30 are switched by time-division inputting, by the time-division drive module 13, the voltage (for example, PVDD) of the second power input terminal or the touch voltage. Namely, when the time-division drive module 13 outputs the voltage (for example, PVDD) of the second power input terminal to the anodes 30, the anodes 30 serve as the common electrodes to drive the organic light emitting layer 4 for display (the first state); and when the time-division drive module 13 outputs the touch drive voltage to the anodes 30, the anodes 30 serve as the touch electrodes to position a touch location (the second state).

The time-division drive module 13 of the present invention includes a self-capacitance change detection unit which may capture the self-capacitance change of each touch electrode. Alternatively, the mutual capacitance is formed between odd-numbered rows of touch electrodes and even-numbered rows of touch electrodes, and the time-division drive module 13 includes a mutual-capacitance change detection unit for capturing the mutual-capacitance change between the odd-numbered rows of touch electrodes and the even-numbered rows of touch electrodes.

The touch detection method of the OLED panel in the present invention may be implemented by means of various display/touch switching schemes or a touch recognition method. For example, each time after the OLED panel displays at least one frame of image, all the anodes 30 are converted to the touch electrodes, and all the corresponding TFTs 2 are turned off to perform at least one complete touch recognition. Alternatively, all the anodes 30 of the OLED panel are the common electrodes. After the OLED panel displays at least 50% of one frame of image, that part of anodes 30 having displayed the image are converted to the touch electrodes, and all the corresponding TFTs 2 are turned off to perform a touch recognition, but the remaining part of anodes 30 not displaying the image yet continue serving as the common electrodes to drive the OLED panel for display, but this is not intended to be limiting.

The time duration for outputting the display drive voltage to the anodes 30 by the time-division drive module 13 accounts for 70%-90% of a total time duration (the total time duration refers to the sum total of the time duration for outputting the display drive voltage by the time-division drive module 13 and the time duration for outputting the touch drive voltage by the time-division drive module 13). That is, within 70%-90% of the total time, the anodes 30 serve as the common electrodes of the OLED panel to drive the organic light emitting layer 4 to display images, and in the rest of the total time the anodes 30 serve as the touch electrodes. The time duration for outputting the touch drive voltage to the anodes 30 by the time-division drive module ranges from 2 ms to 5 ms, but this is not intended to be limiting.

From the foregoing, the anodes in the OLED panel may be multiplexed into the touch electrodes by using the OLED panel and the touch detection method of the present invention, so that no additional touch electrode is needed to be added for touch recognition. Therefore, the thickness of the OLED panel may be effectively reduced, and the production cost of the OLED panel may be lowered.

Embodiments of the present invention are described above. It is to be understood that the present invention is not limited to the foregoing specific implementations, and those skilled in the art may make various variations or modifications within the scope of the claims, which does not affect the substantive content of the present invention.

What is claimed is:

1. An organic light emitting diode (OLED) panel, comprising:
   multiple matrix-arranged thin film transistors (TFTs);
   an anode layer having multiple anodes, formed on one side of the TFTs;
   an organic light emitting layer, the organic layer being formed on one side of the anode layer away from the TFTs;
   a cathode layer having multiple cathodes, the cathode layer being formed on one side of the organic light emitting layer away from the anode layer, the cathodes passing through the organic light emitting layer and being electrically connected to corresponding ones of the TFTs to form pixel electrodes; and
   a time-division drive module electrically connected to the anodes such that the anodes are configured to multiplex time-divisionally to alternately form common electrodes or touch electrodes.

2. The OLED panel according to claim 1, wherein the time-division drive module time-divisionally outputs, to the anodes, a touch drive voltage or a display drive voltage.

3. The OLED panel according to claim 2, wherein time duration for outputting the display drive voltage to the anodes by the time-division drive module accounts for 70%-90% of a total time duration.

4. The OLED panel according to claim 2, wherein the time duration for outputting the touch drive voltage to the anodes by the time-division drive module ranges from 2 ms to 5 ms.

5. The OLED panel according to claim 1, wherein the cathodes have leads extending toward the TFTs, the organic light emitting layer and/or the anode layer has multiple channels, and the leads pass through the channels and are electrically connected to the TFTs.

6. The OLED panel according to claim 5, wherein the channels are contact holes or gaps.

7. The OLED panel according to claim 5, wherein gate electrodes of the TFTs are electrically connected to data lines, source electrodes are electrically connected to a first power input terminal, and drain electrodes are electrically connected to the leads of the cathodes.

8. The OLED panel according to claim 5, wherein the time-division drive module comprises a self-capacitance change detection unit or a mutual-capacitance change detection unit to capture capacitance change of the touch electrodes.

9. The OLED panel according to claim 1, wherein the organic light emitting layer comprises a hole injection layer, a hole transfer layer, a light emitting material layer, an electron transfer layer and an electron injection layer that are stacked in sequence from the anode layer to the cathode layer.

10. The OLED panel according to claim 1, wherein material of the cathodes is magnesium-silver alloy.

11. The OLED panel according to claim 1, wherein the anodes have a three-layer laminated construction, material at a first layer is indium tin oxide, material at a second layer is silver, material at a third layer is indium tin oxide, and the second layer is interposed between the first layer and the third layer.

12. The OLED panel according to claim 1, wherein the TFT is an NMOS transistor or a PMOS transistor.

13. A touch detection method of an OLED panel, wherein the OLED panel of claim 1 is used, the method comprising:
forming the cathodes into pixel electrodes of the OLED panel, and
performing multiplex time-division on the anodes to alternately form into common electrodes or touch electrodes of the OLED panel; and, wherein
when the anode is the touch electrode, a self-capacitance change of each of the touch electrodes is captured or a mutual-capacitance change is captured among the touch electrodes to position a touch location.

14. The touch detection method according to claim 13, wherein the time-division drive module time-division outputs, to the anodes, a touch drive voltage or a display drive voltage.

15. The touch detection method according to claim 14, wherein when the anodes form the touch electrodes, corresponding ones of the TFTs are in an off state, and the cathodes of corresponding subpixels are in a floating state.

16. The touch detection method according to claim 13, wherein each time after the OLED panel displays at least one frame of image, all the anodes are converted to the touch electrodes, and all the corresponding ones of the TFTs are turned off to perform at least one complete touch recognition.

17. The touch detection method according to claim 13, wherein all the anodes of the OLED panel are the common electrodes, and when the OLED panel displays at least 50% of one frame of image, the anodes that have displayed the image are converted to the touch electrodes, and all the corresponding ones of the TFTs are turned off to make a touch recognition.

18. The touch detection method according to claim 14, wherein time duration for outputting the display drive voltage to the anodes by the time-division drive module accounts for 70%-90% of a total time duration.

19. The touch detection method according to claim 14, wherein time duration for outputting the touch drive voltage to the anodes by the time-division drive module ranges from 2 ms to 5 ms.

* * * * *